United States Patent [19]

Keane

[11] 4,263,554
[45] Apr. 21, 1981

[54] FREQUENCY DISCRIMINATOR APPARATUS

[76] Inventor: William J. Keane, 3599 Ensalmo Ave., San Jose, Calif. 95118

[21] Appl. No.: 951,497

[22] Filed: Oct. 16, 1978

Related U.S. Application Data

[62] Division of Ser. No. 631,708, Nov. 13, 1975, Pat. No. 4,127,819, which is a division of Ser. No. 418,232, Nov. 23, 1973, Pat. No. 3,921,085.

[51] Int. Cl.$^3$ .......................... H03K 9/06; H04B 1/16
[52] U.S. Cl. .................................. 328/134; 329/116; 455/263; 455/326; 455/337
[58] Field of Search ................. 328/133, 134; 325/423, 325/435, 446, 448, 487; 329/116

[56] References Cited

U.S. PATENT DOCUMENTS

| | | | |
|---|---|---|---|
| 3,434,057 | 3/1969 | Jackman et al. | 325/423 |
| 3,435,346 | 3/1969 | Allen et al. | 325/423 |
| 3,515,996 | 6/1970 | Nixon et al. | 328/133 |
| 3,922,483 | 11/1975 | Indri | 325/423 X |

OTHER PUBLICATIONS

Proceeding of IEEE vol. 60, No. 12, Dec. 1972 "A Sampling FM Wide-Band Demodulator Useful For Laser Doppler Velocimeters" By Iten & Dandliker pp. 1470-1475.

*Primary Examiner*—John S. Heyman
*Attorney, Agent, or Firm*—Limbach, Limbach & Sutton

[57] ABSTRACT

A frequency discriminator having at least one ferrimagnetic resonator in a band pass or band reject configuration, the frequency of which is swept over a frequency band of interest, a detector receives the filter output, and the timing relationship between the detector output and the swept frequency is compared to generate the discriminator output. The discriminator has a bandwidth variable from a relatively narrow range to a very wide range in which the center frequency is simultaneously tunable over an extremely wide frequency range. The discriminator is insensitive to amplitude variations of the input signal and is capable of demodulating low level signals. The frequency discriminator is particularly useful for microwave frequency applications, for example, as a discriminator in a simple microwave FM receiver.

29 Claims, 12 Drawing Figures

FREQUENCY DISCRIMINATOR APPARATUS

This is a divisional of application Ser. No. 631,708, filed Nov. 13, 1975, now U.S. Pat. No. 4,127,819 which in turn is a divisional of Application Ser. No. 418,232, filed Nov. 23, 1973, now U.S. Pat. No. 3,921,085.

BACKGROUND OF THE INVENTION

This invention relates to frequency discriminators and their applications and particularly to a frequency discriminator having a variable bandwidth over a wide range in which the center frequency is simultaneously tunable over an extremely wide bandwidth. Although the invention is particularly useful in microwave frequency applications it is not limited to such uses. Also, while the preferred embodiments disclosed herein typically employ ferrimagnetic resonators, such as YIG (yittrium-iron-garnet), other elements having similar characteristics may be used subject to the performance characteristics of such other elements.

Center frequency tuning of prior art resonant circuit discriminators consists of basically two different types: mechanically or electronically tuned center frequency. Both types use either the amplitude or phase versus frequency characteristics of a single or dual resonant circuit to indicate the frequency of the input signal relative to the discriminator center frequency. In the amplitude comparison mode, a dual mode resonant circuit is preferred with dual detectors. In the phase comparison mode, a single resonant circuit is often sufficient with dual detectors used to convert phase to amplitude. The output of such prior art discriminators is very sensitive to the amplitude of the input signal, and they require critical and expensive means to lessen such amplitude dependence.

Because of the amplitude comparison between dual detectors required in prior art approaches, improving the discriminator's capability to detect low level signals is only possible by introducing signal gain at the carrier frequency. The critical problems of tracking detectors over a wide dynamic range and the need for tracked high gain video amplifiers makes application after detection impractical.

The bandwidth of the prior art discriminators is generally fixed by the loaded Q of the resonant circuit and/or the circuit coupling factors in the case of dual mode resonators. In many applications, compromises must be made between the desired discriminator bandwidth, linearity and resolution. For example, a wide bandwidth is often desirable to ensure that the input frequency falls within the discriminator range; while a narrow bandwidth is desirable to provide the best possible frequency resolution. It is also difficult to achieve wide bandwidths and good linearity simultaneously because of the phase and amplitude non-linearity of the resonant circuit. Another characteristic of the prior art discriminators is the difficulties in achieving a wide tuning range of the center frequency. The limitations of mechanically tuned circuits are due to the fact that physical dimensions have to be changed and often multiple resonant circuits must be tracked to maintain constant discriminator bandwidth. In the microwave frequency region, this limitation has been overcome to some extent by substituting ferrimagnetic cavities that can be electronically tuned over a wide bandwidth. Thus, yittrium-iron-garnet (YIG) discriminators have been built in the manner of Nathanson (U.S. Pat. No. 3,274,519) using amplitude comparison or Goodman et al (U.S. Pat. No. 3,364,430), Hoover et al (U.S. Pat. No. 3,562,651) and Pircher (U.S. Pat. No. 3,622,896) using phase characteristics of YIG resonator. In the dual mode amplitude comparison approaches, center frequency tuning range is limited by ability to divide input amplitude equally between two cavities and the ability to track cavities to maintain a constant bandwidth. In the phase reference approach, the center frequency range is limited by the bandwidth of broadband phase shift networks necessary to establish proper phase reference and the ability to equally divide input power. Current practice limits center frequency tuning range to about a single octave.

Both YIG discriminator approaches have narrow, fixed bandwidth characteristics whose output voltage versus input frequency slope is sensitive to input signal amplitude and center frequency changes, and whose linearities are difficult to maintain because of impedance mismatches and spurious resonant nodes in the ferrimagnetic resonator. Both discriminator types require dual detector outputs and expensive and bulky ancilliary microwave components; both require extensive critical alignment to cover wide tuning range with near constant discriminator slope.

In the specific prior art approaches applied to automatic frequency control, a single, fixed center frequency mechanically tuned cavity has been used to stabilize the frequency of high frequency generators. In one method of approach for this application, a cyclical mechanical modulation of the center frequency of the cavity has been used to sense the position of the generator frequency relative to the cavity center frequency and provide a correction signal to control the generator. The purpose of this approach was to use the superior mechanical stability of the cavity to stabilize the frequency of the generator. The cavity was tuned sinusoidally by mechanical means and the rate of tuning was limited to slow variations inherent in mechanical variations of the cavity. The application of the present invention in automatic frequency control is to vary the center frequency of the generators by tracking them to the variable center frequency of the discriminator. Bandwidth adjustments on the discriminator can be made to facilitate the initial capture of the generator and then to maximize the frequency resolution. The sample rate of the discriminator is electronically controlled and can be optimized to match the desired tuning rate of the generators.

SUMMARY OF THE INVENTION

It is the general object of the present invention to provide a frequency discriminator whose bandwidth and center frequency can be tuned electronically. The discriminator slope will be insensitive to input signal amplitude or changes in center frequency. The linearity of the discriminator will be maintained for both wide and narrow bandwidths and the center frequency of the discriminator can be tuned over multi-octave frequency ranges. This discriminator will also be able to demodulate low level signals by using high gain amplification after crystal detection.

Another object of this invention is to provide a low cost discriminator to demodulate frequency modulated voice or data communications.

A frequency discriminator is provided including an electronically tunable resonant circuit, such as a YIG resonator and a detector connected to the resonantor output. The band or spectrum of frequencies containing the input signal or signals of interest are linearly swept by the resonator circuit. The relative position of the detector output is then compared with the sweep waveforms to provide the discriminator output. Since the relative position of the detected output does not change as a function of the input signal level, the discriminator slope is independent of signal amplitude. The sweep rate of the resonator must provide at least two samples within one period of the frequency of the highest modulation component in order to accurately demodulate the information. For a non-modulated carrier, frequency can be determined in a single sweep.

The resonator may be used in either a band-pass or band-reject mode and several advantages accrue for each in particular applications. In the case where a ferrimagnetic resonator is used as the resonant element, the center frequency of the discriminator can be readily changed by controlling the current through an electromagnet. The sweeping signal can then be superimposed on the center frequency tuning current to generate a sweep of the resonator. Preferably, however, an auxiliary air core inductor is used to superimpose a variable magnetic field across the resonator. By using an air core inductor, the resonator can be swept without magnetic hysteresis or saturation and at much faster rates than would be possible through the electromagnet. Since the ferrimagnetic resonator tunes linearly with magnetic field, a very high degree of discriminator linearity is achievable by using a linear current driving source. The bandwidth of the discriminator can be controlled very accurately from a few MHz to several hundred MHz by changing the magnitude of the current drive.

These and numerous other advantages of the present invention will become apparent as the following detailed description and accompanying drawings are read and understood.

DESCRIPTION OF THE PREFERRED EMBODIMENTS

Figure 1:
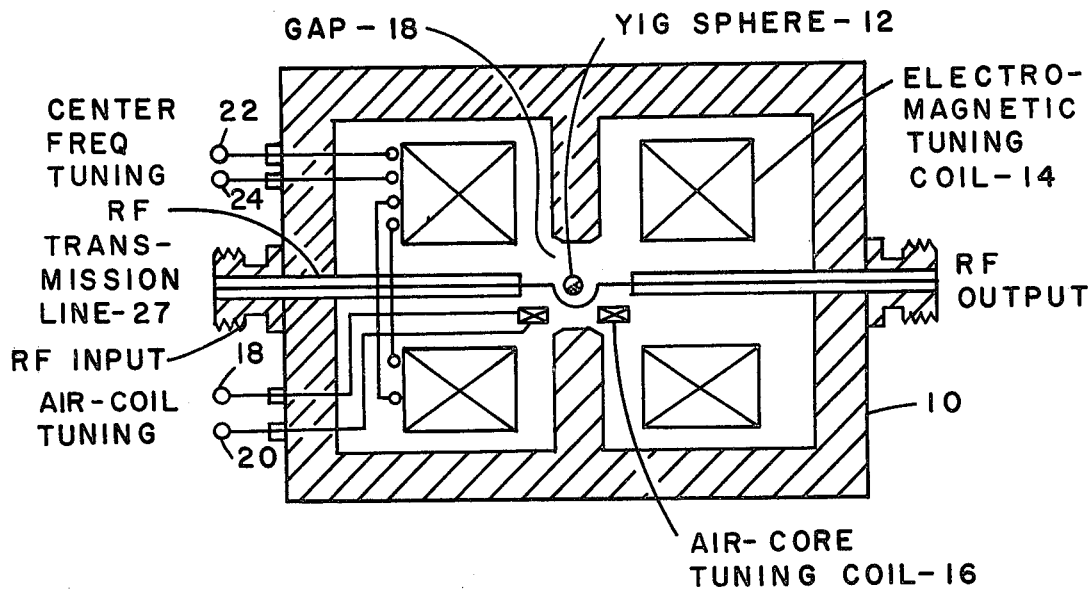
FIG. 1 is a cross-sectional view of an exemplary YIG resonator assembly including a magnetic housing, YIG sphere and electromagnetic and air tuning coils for use in a frequency discriminator according to the present invention.
Figure 2:
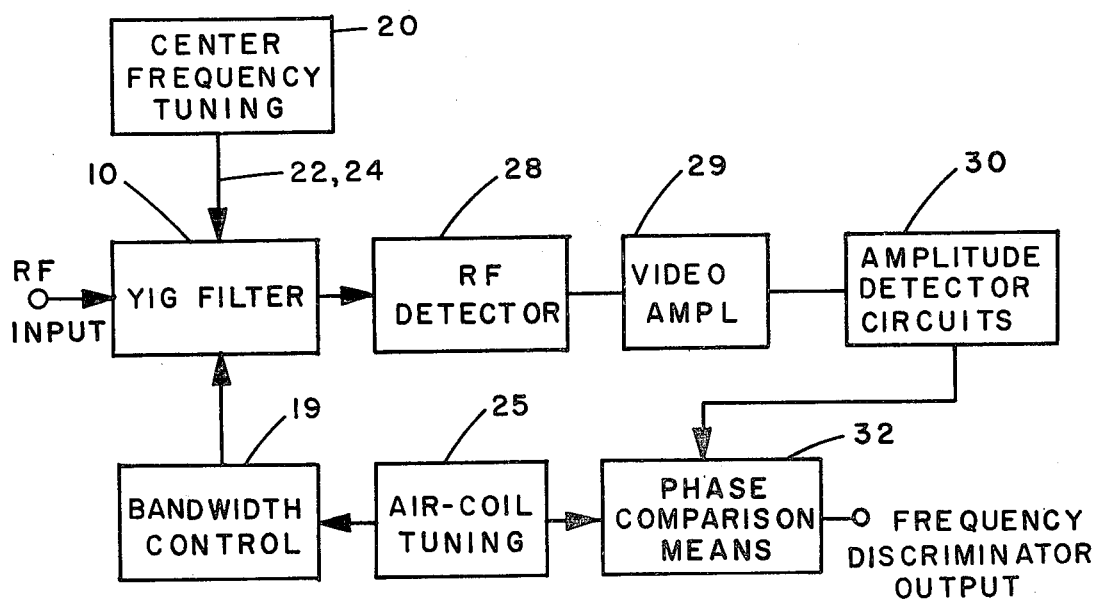
FIG. 2 is a block diagram of an embodiment of the frequency discriminator according to the present invention.

Referring first to one basic preferred embodiment of the frequency discriminator according to the present invention as shown in FIGS. 1 and 2, wherein FIG. 1 shows in cross section a YIG filter 10 which is usable to the block diagram of FIG. 2. The YIG filter 10 includes a single resonator YIG sphere 12 whose center frequency is tuned by means of an electromagnet tuning coil 14 (shown in cross section) as a function of the electromagnet 14 tuning current, and a small air coil 16 which surrounds the YIG sphere 12 in the electromagnet gap 18. As explained further hereinafter, the air coil 16 is driven by a periodic waveform that displaces the resonant frequency of the YIG filter cavity by an amount on either side of the quiescent frequency proportional to the current in the coil set by bandwidth control 19. The advantages of an air coil (although the same effect is possible by scanning in a periodic waveform into the main tuning part of the electromagnet) are: the offset is zero, i.e., if there is no current in the coil 16 there is no effect on the YIG 12 resonance; the time constant is considerably smaller because the inductance of coil 16 is less and an air core has no magnetic time constant, consequently, the resonance can be tuned faster; and an air coil core does not exhibit magnetic hysteresis or saturation, thereby insuring a linearity and slope independent of center frequency tuning.

Figure 3:
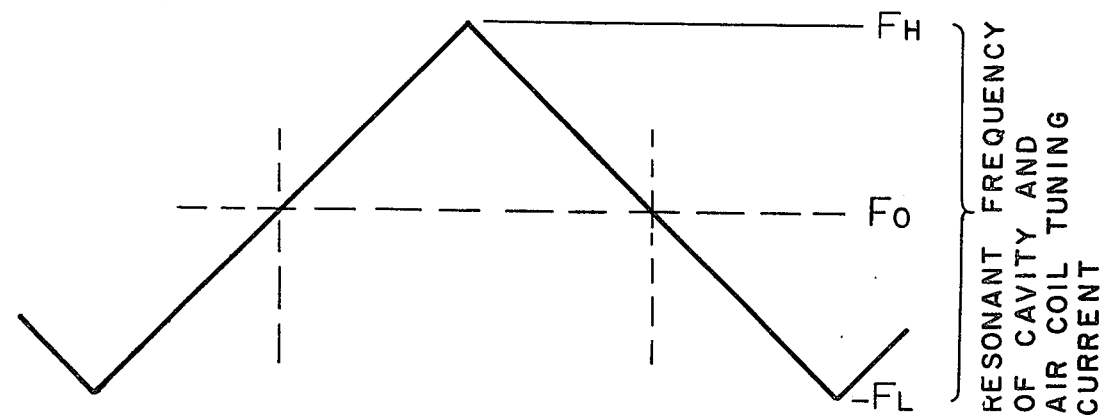
FIG. 3 is a graphic presentation of a cyclic current waveform suitable for tuning the air coil of FIG. 1.

The center frequency tuning source 20 applied to the electromagnet tuning coil 14 on lines 22 and 24 sets the center frequency operation for the YIG filter 10. The center frequency tuning source 20 provides a current for driving the electromagnet tuning coil 14. The current could be made proportional to frequency so that a fixed level input signal sets the center frequency of the discriminator to a fixed frequency or, alternately, the control current could be continually swept so that the center frequency of the discriminator is continually tuned. It will be apparent that the nature of the control current for center frequency tuning of the YIG filter 10 may be varied depending on the application in which the discriminator is to be used. At the same time that the center frequency tuning source 20 is operating, the air coil 16 is being tuned by an air coil tuning source 25 with a cyclic current as shown in FIG. 3.

The shape and generation of the driving waveforms can be of a variety of forms. They, in fact, can be shaped to provide a particularly desirable transfer function for the discriminator. It is only important to control the driving waveform so that its position is known at a particular time with respect to some reference timing position. All of the information needed to generate a discriminator waveform is included in a single sweep from the lowest frequency $F_L$ to the highest frequency $F_H$. If, as is commonly required, the desired discriminator curve is linear, then the resonator tuning should be linear.

The amplitude of the tuning current to the air coil 16 which is set by the bandwidth control 19, determines the extent that the YIG resonance is tuned off its quiescent (or $F_o$) value. Therefore, by varying the amplitude of the drive current in 19, the width of the resonance sweep can be readily adjusted. As explained further below, this is equivalent to varying the bandwidth of the discriminator. Typical variations of bandwidth could be ±400 MHz to as low as ± a few MHz. This capability is extremely important and is not characteristic of prior art frequency discriminators.

To this point the drive currents for the YIG 12 resonator have been described. The drive is made up of two parts: (1) the bias or center frequency tuning to the electromagnet tuning coil 14 which controls the quiescent or $F_o$ value, (2) the cyclical delta F ($\Delta F$) tuning from $F_L$ to $F_H$ the amplitude of which can be varied to vary the width of the YIG resonator and therefore the bandwidth of the discriminator.

Alternately, the bias tuning could be provided by a permanent magnet, a mechanical variation of the magnetic gap or any combination of electrical and permanent magnet biasing. The cyclical magnetic field can be introduced at rates from DC up to several MHz.

As the YIG resonator is tuned across the $\Delta F$ range with a controlled sweep waveform, the position in the sweep where the resonator is tuned to a particular frequency must be sensed. In order to accomplish this, the YIG resonator is coupled to a transmission line 27 in such a way that the amplitude of a signal on this line within the $\Delta F$ range is amplitude modulated by the resonant YIG cavity 12. The YIG resonator can be coupled into the transmission line in either a band-pass or a band-reject mode. In the band-pass mode the RF detector 28 is coupled to the output of the transmission line 27 and as the tuning of the resonator approaches the RF signal frequency the amplitude of the RF detector increases. In the band-reject mode, shown in FIG. 1, the detector 28 is coupled to the transmission line 27 and as the tuning of the resonator 12 approaches the RF signal frequency the amplitude of the RF detector 28 decreases. The choice of coupling will be determined by the particular application; the principle of operation is the same.

For maximum resolution, it is important that the loaded Q of the resonator be as high as possible within practical limits. This means that the unloaded Q of the resonator is maximized, that all cavity and coupling losses are minimized, and that the cavity is loosely coupled to the output.

Figure 4:
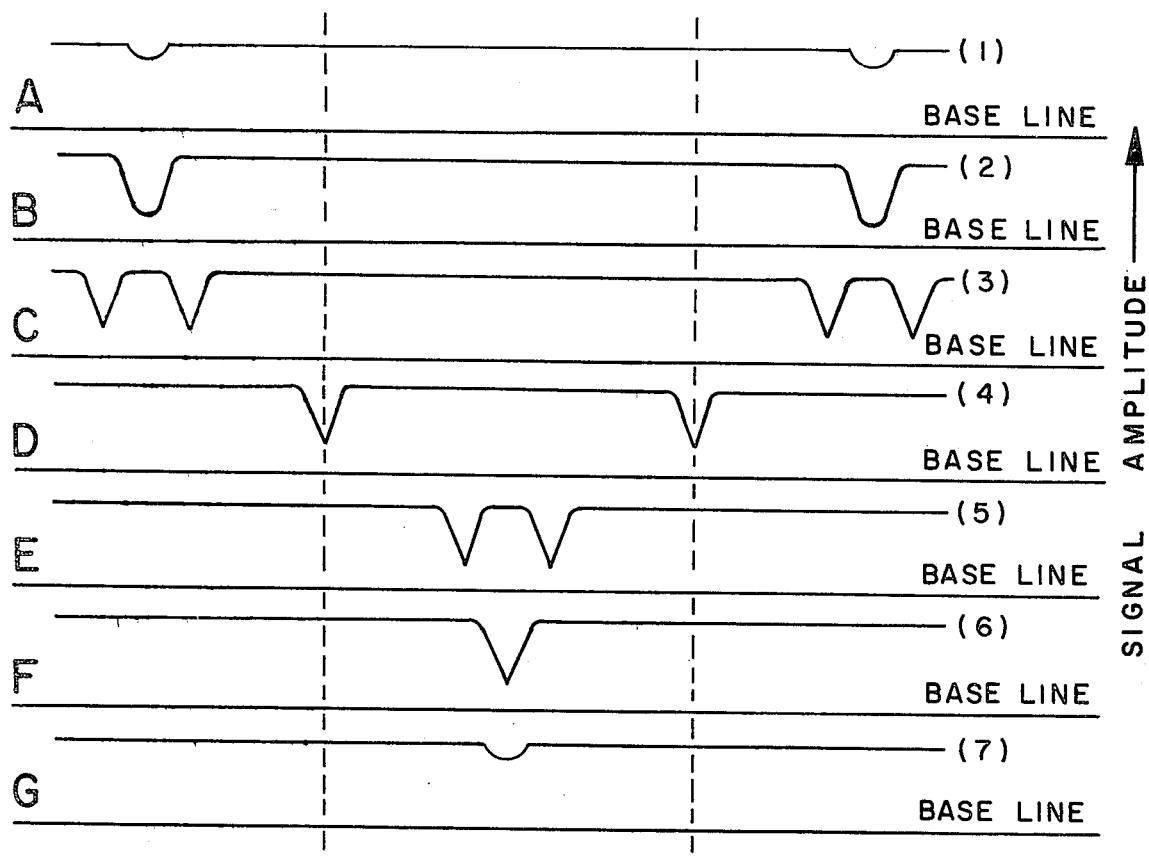
FIGS. 4A–4G relate to FIG. 3 and are graphic presentation of a series of waveforms illustrating typical outputs from the YIG resonator of FIGS. 1 and 2 when the resonator is operated in a band-reject mode as the air coil tuning current tunes the resonator frequency from $F_L$ to $F_H$.

FIG. 4 shows waveforms illustrating typical outputs when the YIG resonator is arranged in a band-reject mode. The outputs indicated occur as the input frequency is tuned from $F_L$ to $F_H$.

In FIG. 4A the signal frequency is just barely below the frequency $F_L$. Therefore only a small portion of the resonance amplitude change is detected. In FIG. 4B the signal frequency is at the $F_L$ frequency and the amplitude response reaches a peak value. In FIG. 4C the signal frequency falls within the $\Delta F$ range and therefore it is detected twice; once on the positive slope and once on the negative slope. In FIG. 4D the signal frequency is at the center of the sweep, $F_o$. The resonance peak is equally spaced on both the negative and positive slopes from the sweep extremes.

FIGS. 4E, 4F and 4G repeat the same sequence except that they recur inverse to FIGS. 4A, 4B and 4C.

Therefore, if only one peak occurs during the triangular sweep, the signal is at either $F_L$ or $F_H$. Exactly where is readily indicated by determining the time in the sweep they occur. It is important to note that all of the necessary phase information is located on either the positive or negative slope. The second slope contains redundant information. Since the YIG resonance is directly proportional to the changing magnetic field of the air coil caused by the tuning current, if the current is linear the resonance point moves linearly over the entire $\Delta F$ range. Therefore, the exact position of the resonance gives an exact measure of the offset of the signal frequency from the quiescent frequency ($F_o$) when the air coil tuning coil current is zero.

This linear discriminator characteristic is in sharp contrast to more conventional discriminators which consist of multiple diodes tuned to different resonant circuits which are subtracted from one another. The resultant discriminator curve is quite non-linear, particularly at the extremes of the bandwidth.

Figure 10:
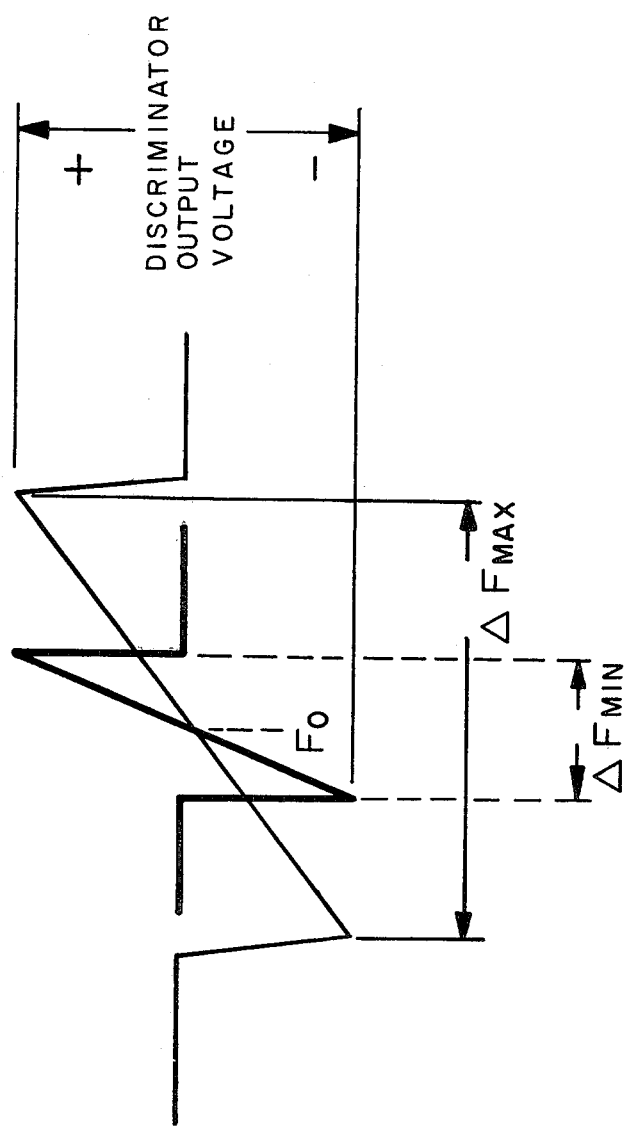
FIG. 10 is a graphical presentation of the output voltage versus frequency of the discriminator of FIG. 2 at its maximum and minimum bandwidths.

Referring again to the block diagram of FIG. 2, the RF detector output is amplified in video amplifier 29 and coupled to an amplitude detection circuit 30 which processes the peaks or dips in the RF detector 28 output amplitude. The amplitude detector circuit 30 output is applied to a phase comparator 32 which also receives an input from the air coil tuning current source 25. The output of phase comparator 32 is the frequency discriminator output. FIG. 10 shows the discriminator output voltage versus frequency for narrow bandwidth ($\Delta F_{min}$) and wide bandwidth ($\Delta F_{max}$) around the quiescent frequency $F_o$ for the case of a linear triangular current to the air coil 25, such as is shown in FIG. 3. The waveshapes are each the well-known discriminator characteristic. Preferred embodiments for processing the RF dectector amplitude and comparing its phase to the air coil tuning sweep to generate the conventional discriminator characteristic are described in later sections.

Another substantial advantage of this discriminator is that it is theoretically independent of signal level. Frequency is indicated by comparing the time difference (or phase) of the peak of the resonance curve to the sweep waveform in phase comparator 32.

Figure 5:
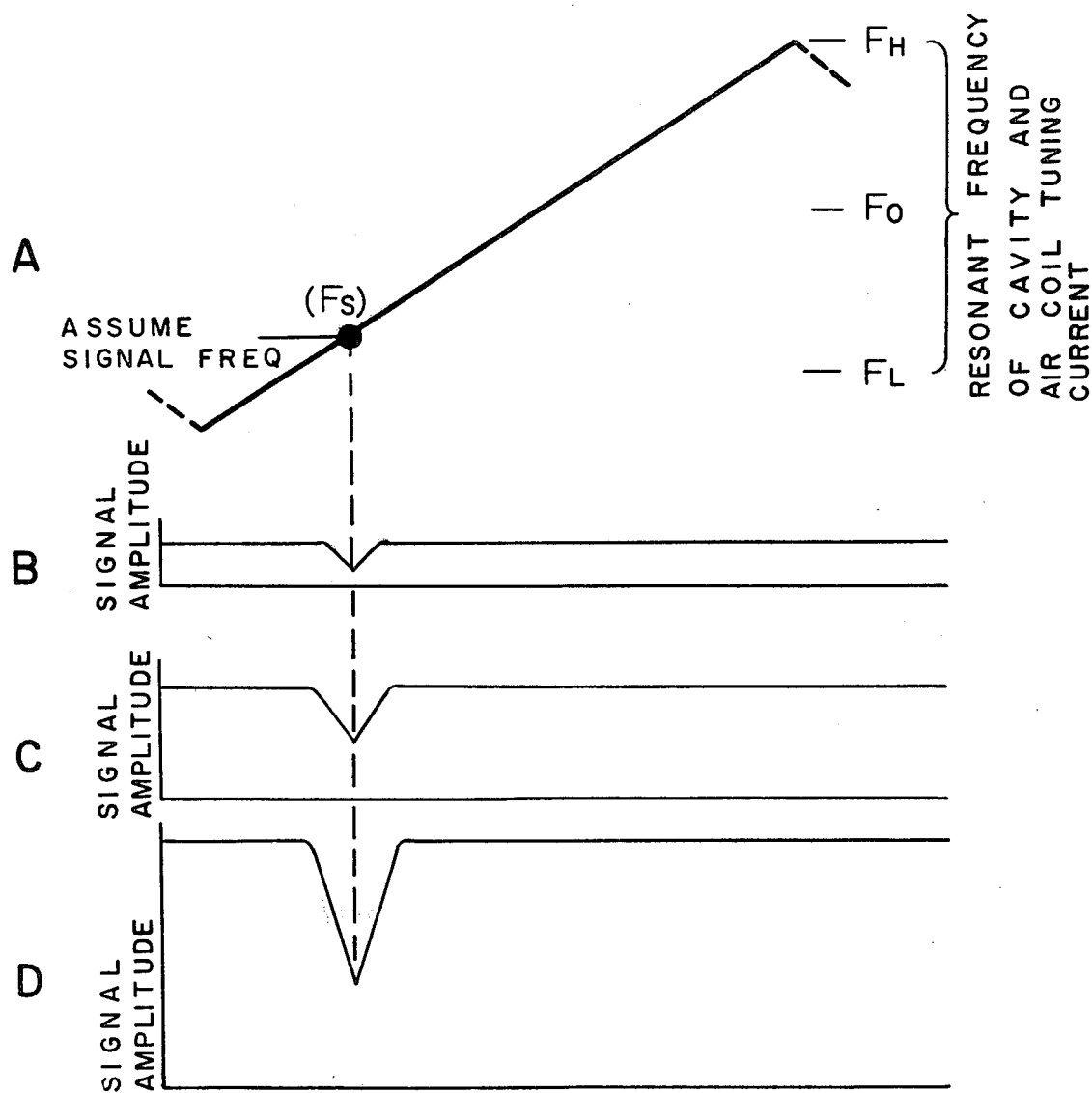
FIGS. 5A–5D are a series of waveforms illustrating that the position of the peaks as in FIGS. 4A–4G are independent of input signal level.

FIG. 5A indicates that the position of the peak is independent of the signal level. As the amplitude of $F_S$ increases, the output signal amplitude from RF detector 28 also changes as shown in FIGS. 5B, 5C and 5D, however, the phase or the relative timing of the peak of the resonance of the sweep waveform is unchanged. Therefore, the discriminator output is theoretically independent of input signal amplitude. A practical consideration, however, is the thermal heating of the YIG resonator at higher power levels (typically greater than 1 milliwatt). If the YIG sphere 12 is not oriented on the zero temperature axis, there will be a transient reduction or change of the anisotropic field in the YIG material which can alter the resonant frequency. This effect can be reduced to an insignificant amount if the YIG sphere 12 is oriented on its internal zero temperature drift anisotropic axis.

The performance of a microwave frequency discriminator according to the present invention may be contrasted to the performance of typical prior art frequency discriminators whose output is a function of input amplitude and therefore normally require limiters to maintain a constant discriminator slope. In contrast, this new discriminator technique is independent of input signal level and since there is only one detector there are no detector or amplifier tracking problems. Also, since the sweeping resonator is basically a sample system, a DC amplifier is not necessarily required.

Because of the single channel signal processing, this now discriminator offers a significant advantage in applications where it is necessary to demodulate or control low level signals. Prior art discriminators, using single or multiple detectors, whose discriminator slope was a function of absolute or compared amplitudes, require system gain at RF prior to detection for increased sensitivity. The non-linearities of the detectors, the difficulties of tracking these detectors over a wide dynamic range, the difficulties in tracking high gain amplifiers after RF detection and the need for amplitude limiting, or at least sensing at RF, precluded the possibility of improving signal sensitivity with post-detection amplification. These limitations are not present in this invention and a 30 to 40 db improvement in sensitivity is possible over prior art discriminators. For a wide tuning range discriminator, e.g. covering a 1 to 12.4 GHz tuning range, the cost savings in RF amplifiers is very considerable.

In the novel discriminator of FIG. 2, a video or log video amplifier 29 of standard design following the RF detector 28 can be used to increase the sensitivity. In this manner the discriminator can achieve sensitivities that are typically accomplished with standard crystal video receivers that are used for amplitude or pulse modulation detection. RF preamplification can also be added prior to the RF detector 28 or YIG filter 10 if additional signal sensitivity is required.

Another unique feature of the discriminator according to the present invention is that the bandwidth can be readily varied from a few MHz to several hundred MHz. This is accomplished by varying the amplitude of current driving the air coil 16 of FIG. 1. The lower limit is set by the loaded Q of the resonator: as the scan is decreased the peak of resonance is more difficult to sense. The upper limit is set by the maximum amount of current that can be forced through air coil 16 until there is damage to the coil or YIG sphere 12 due to thermal effects.

The bandwidth variation of this new discriminator, over a range of 100:1 or better, is in sharp contrast to the fact that prior art microwave discriminators (including YIG types) do not have any capability to vary their bandwidth electronically. In contrast to conventional YIG tuned discriminators, the maximum bandwidth is about ten times wider than can currently be achieved.

The discriminator of this invention can, therefore, provide the widest possible bandwidth for capturing or measuring a signal frequency and yet also provide the narrowest bandwidth for maximum resolution and highest tuning slope. Both wide and narrow band operation retain the excellent linearity characteristics and insensitivity to signal amplitude variations.

Under one principal embodiment, operation depends on a tunable resonant cavity which is not limited to a YIG cavity, and whether a band-reject or band-pass cavity is used depends on the application—whether a single pole or multiple pole filter is used also depends on the application.

Certain unique properties of the discriminator according to this invention are best understood by the examination of the transfer characteristic of the detector in the presence of multiple signals. Theoretically, the RF detector 28 (FIG. 2) can rectify input signals over the entire frequency range from a few MHz to above 26 GHz. In practice, however, a DC return for the crystal input and an RF bypass and the output limit the range somewhat. Nevertheless, it is important to note that the frequency range of the discriminator is not limited by the RF detector 28 in any theoretical way.

Figure 6:
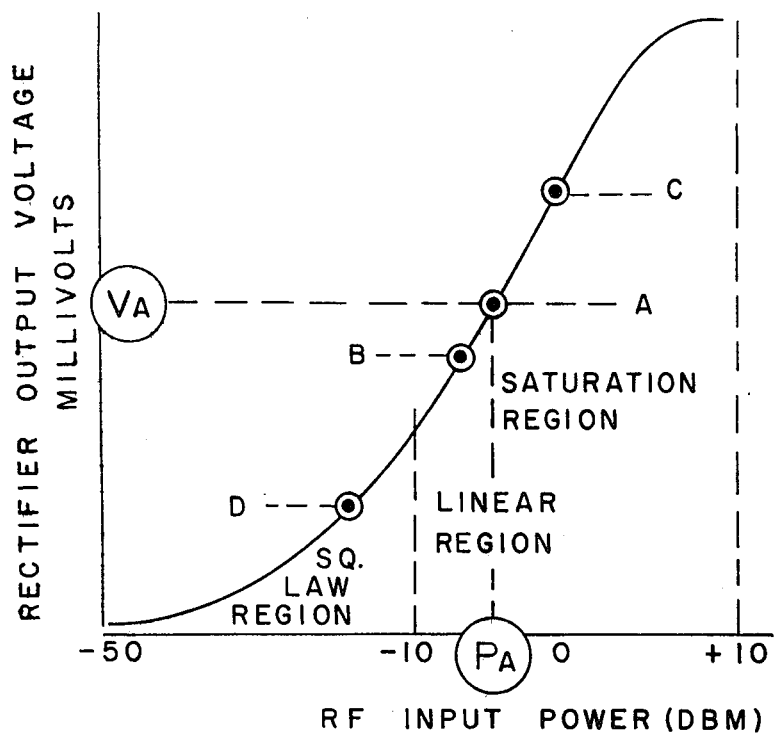
FIG. 6 is a graphical presentation showing the effect of multiple signals on a non-linear detector.

Referring to FIG. 6, which shows a typical detector curve of input power versus rectified output voltage, and neglecting any mixing products generated by multiple signals in the non-linear detector, the rectified output is affected as follows:

If an input signal of frequency falling within the range of the detector is incident on the detector with power equal to ($P_A$), then the rectified output voltage from the detector will be ($V_A$).

If a signal of level A and a signal of level B are simultaneously applied to the detector, then the rectified output voltage will be equal to a voltage corresponding to a signal of power $P_A + P_B$. If the signals are of equal power then, in square-law region, the output voltage will double; in the linear region, the output voltage will increase about 1.4 times; in the saturated region it is possible that there will be no increase in output voltage.

If a signal of level A and a signal of level D are applied to the detector the output voltage will correspond to an input power of $P_A + P_D$. If $P_D \leq 10$ db of $P_A$, there will be at most a 10 percent change in $V_a$ with the introduction of signal D. If $P_D \leq 20$ db of $P_A$, there will be at most a 1 percent change in $V_a$ with the introduction of signal D. Therefore, it is practical to say that the output voltage from RF detector 28 is virtually independent of signal D.

If a signal of level A and a signal of level C are applied to RF detector 28, and if signal C is 20 db more power than signal A, likewise the output voltage will be primarily due to C. Signal A will have only a 10 percent effect on the output voltage.

In the case of a band-reject cavity, the response of the detector to multiple signals leads to several interesting properties for the novel discriminator according to this invention.

The discriminator will provide an output only for the largest input signal, if the largest signal is about 10 db above any other residual signal. Therefore, for example, if the discriminator is used to control an oscillator, it will automatically lock onto the fundamental output as long as harmonics are suppressed by greater than 10 db. Also, if the input signal has other spurious signals greater than 10 db down, the discriminator will select the desired input. Thus, the presence of the input signal will be detected by the discriminator, as it is scanned through the entire frequency range, only for the largest RF signal amplitude in the range.

This is in direct contrast to more conventional cavity discriminators, which have no easy way to distinguish the desired signal from other spurious signals. This is particularly the case when the input signals can extend over a very wide frequency and amplitude dynamic range (e.g. 20 GHz and greater than 40 db respectively).

Figure 7:
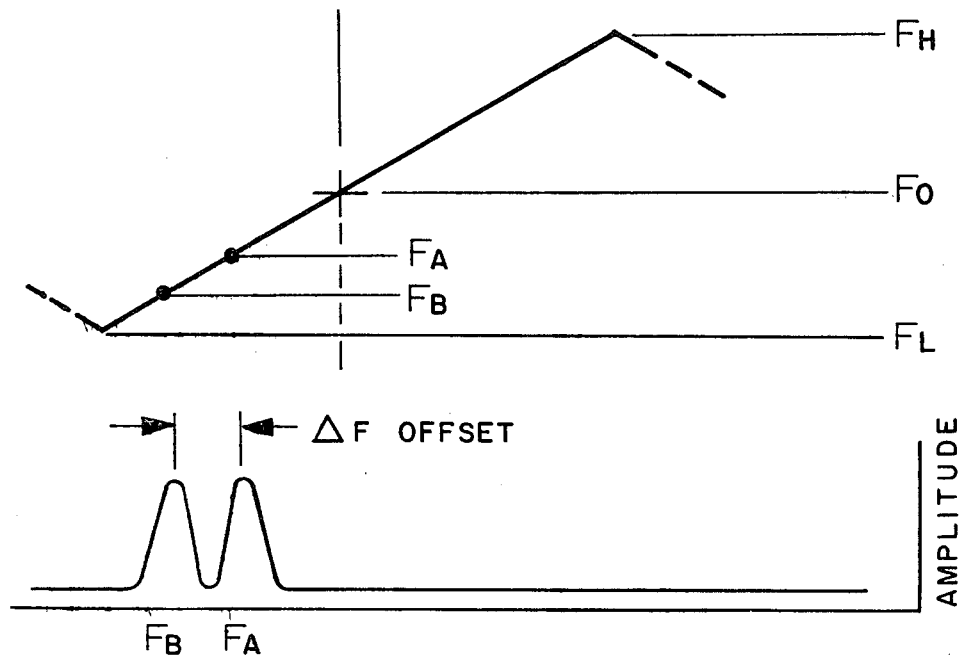
FIG. 7 is a graphical presentation of waveforms illustrating the effect of two signals within the bandwidth of a discriminator operating in the band-pass mode according to the present invention.

The case where the resonant cavity of the discriminator according to the present invention is a band-pass filter is shown in FIG. 7. Note that the output of the discriminator in this case is an amplitude peak rather than an amplitude dip. In all other respects the principle of operation is the same.

The principle advantage of the band-pass approach is its operation in the presence of multiple signals. The advantages of the band-pass approach are opposite to those of the band-reject, principally as follows.

Unlike the band-reject approach, the band-pass discriminator is only responsive to signals within its bandwidth (assuming infinite off-resonance rejection as the ideal case). Therefore, it can be programmed to lock onto any particular signal, not necessarily the largest signal. If the signal occurs outside of the discriminator bandwidth, there will be no output from the detector. This rejection can be made infinite for a CW signal be capacitively coupling the diode output. Thus, since the signal will not be modulated by the cavity, it will not be coupled through the discriminator even if there is a DC rectified output in the detector.

Another advantage of the band-pass versus band-reject approach is the operation in the presence of multiple signals in the desired bandwidth. Conventional discriminators cannot provide useful outputs if two signals of like amplitude occur simultaneously within the same discriminator bandwidth. As is indicated in FIG. 7, two signals can be processed independently in the discriminator by sorting them out after video detection.

In the band-pass approach there might be some benefit to increasing the number of resonators. This could increase the off-resonance isolation of the YIG filter and also would make the filter skirt response sharper. This might be used if the dynamic range of the input signals was particularly large. It has the disadvantage that the air coil would have to put an identical magnetic field on both resonators or else the cavities would not track exactly and the resolution might suffer.

The electronic control of the air coil sweep 25 and the capability to adjust the bandwidth of the discriminator in bandwidth control 19 of FIG. 2 make possible several preferred embodiments for generating the characteristic output voltage versus input frequency discriminator curve. FIG. 8 illustrates two methods of comparing the detector output to the phase of the sweeping means. Both depend on generating a trigger pulse at the peak (or fixed threshold level) of the detected output signal illustrated in FIGS. 4b through 4f. These methods are preferred for those applications in which the discriminator bandwidth is very wide with respect to the bandwidth of the resonator and/or accurate frequency information is required in a single sweep.

Figure 8A:
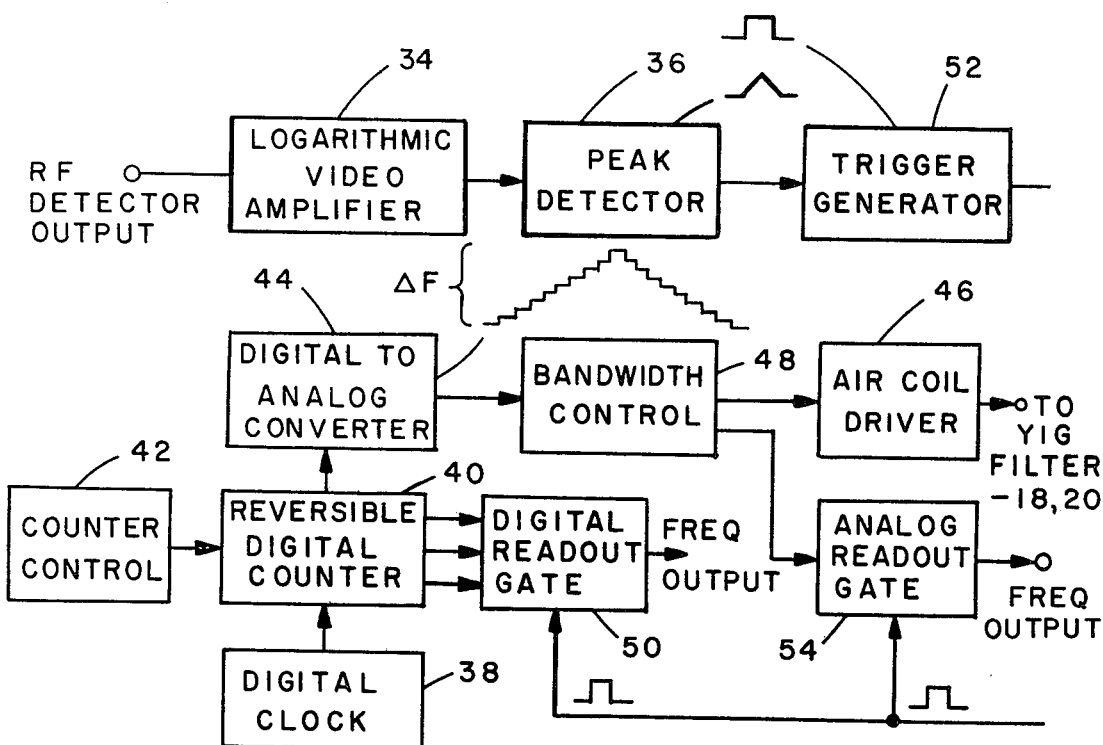
FIGS. 8A and 8B are block diagrams of phase comparison methods useful in this invention when the RF detector output is used to generate a trigger at its peak response.

In FIG. 8a the output of the detector is coupled through a logarithmic video amplifier 34 whose output is proportional to the input power. When a band-reject resonator, as illustrated in FIG. 1, is used to generate the detector output, the rejected power is independent of the absolute input power and the resulting voltage waveform from the log video amplifier 34 is normalized. This simplifies the design of peak detection 36 which generates a standard output trigger at the peak (or fixed threshold level) of the detected waveform. At the same time, a sawtooth or triangular waveform, similar to that shown in FIG. 3, is used to drive the resonator cyclically between $F_L$ and $F_H$ in a linear fashion. The position of the trigger with respect to the input voltage to the sweeping means can then be calibrated to read out the frequency directly relative to the center frequency of the discriminator.

In FIG. 8a the calibrated sweeping means consists of clock 38 driving a reversible digital counter 40 which counts sequentially in either increasing or decreasing counts as controlled by counter control 42. The counter then programs a standard digital to analog converter 44 to generate an output voltage linearly proportional to the number of clock pulses counted. The output of the D/A 44 is then fed to the air coil driver 46 sweeping the resonator linearly across the predetermined bandwidth. Bandwidth control 48 is a scaling control which adjusts the current drive into the air coil to correspond to the desired discriminator bandwidth. The input frequency to the discriminator is then determined by gating out the digital count in counter 40 by readout gate 50 at the time of the intercept trigger generated in trigger generator 52. This provides an immediate digital indication of frequency relative to discriminator center frequency. Alternatively, the calibrated analog output of the bandwidth control 48 could be gated through readout gate 54 to generate an analog measure of relative frequency. Obviously, analog outputs could also be provided with simpler voltage generated sweeping means than illustrated, the prime requirement, however, is that a linear relationship exists between the sweeping means and the position of the resonator in order to obtain a linear discriminator curve.

The digital or analog measure of input frequency relative to the discriminator center frequency represent a sampled demodulation of the input signal at rates equal to sweep rate of the particular sweeping means. Standard procedures for processing sampled input signals can be used to recover the input modulation.

Figure 8B:
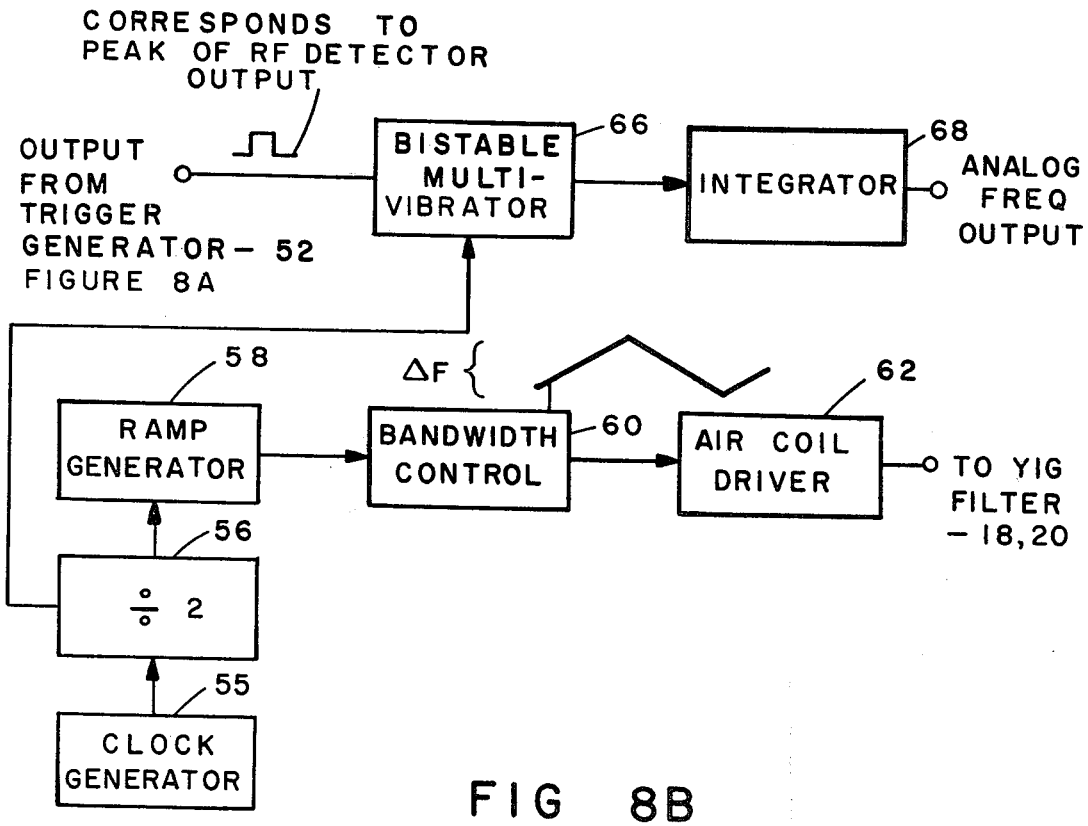

FIG. 8b illustrates an alternate embodiment for comparing the phase of the detector output to the sweeping means to generate the standard discriminator curve. Again the trigger generating means of FIG. 8a is used to detect the peak output of the resonator. The sweeping means is generated by dividing by 2 the frequency of clock generator 55 in divider 56. The output pulse from divider 56 is integrated in ramp generator 58 to generate a linear triangular waveform similar to that shown in FIG. 3. The voltage output of this waveform is scaled in bandwidth control 60 to set the desired discriminator bandwidth. The output of control 60 is used to drive air coil driver 62 to generate a linear resonator sweep.

The trigger pulse from trigger generator 52 in FIG. 8a is used to control a bistable multivibrator 66 that is referenced to divider 56. This phase comparison method is similar to that described in the prior art by C. E. Arnold et al (U.S. Pat. No. 2,764,682). The output of multivibrator 66 is integrated an integrator 68 to provide an analog voltage proportional to the position of the trigger pulse (the detected output) relative to the driving waveform of the resonator. The output therefore measures the relative phase between the detected input signal and the sweeping means. If the sweeping means is linear over the predetermined bandwidth, the analog output will be a linear function of frequency across the entire bandwidth of the discriminator.

Figure 9A:
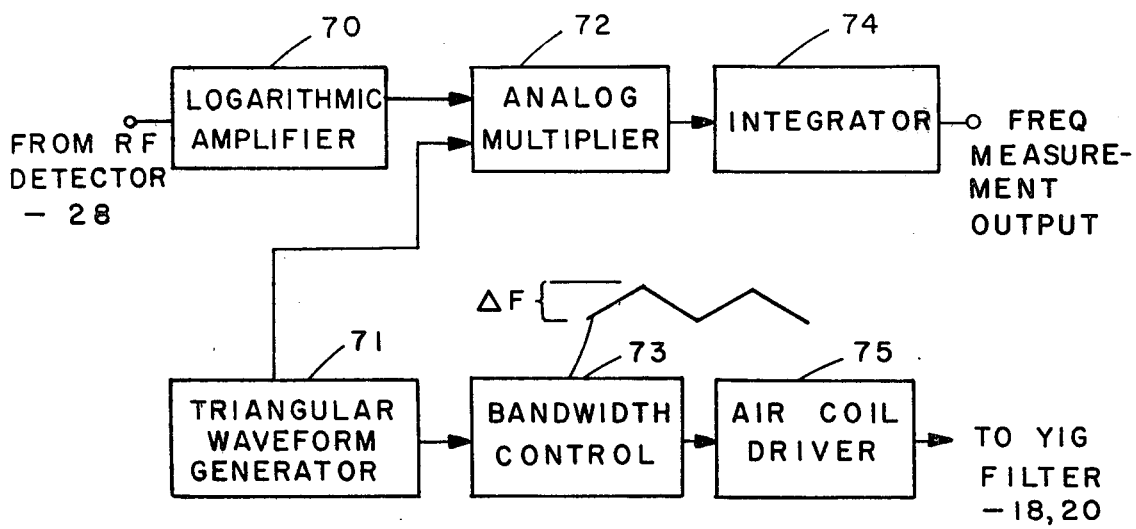
FIGS. 9A and 9B are block diagrams of phase comparison methods useful in this invention when the analog output of the RF detector is processed.

In those applications where the bandwidth of the discriminator is required to be relatively narrow with respect to the bandwidth of the resonator, or where spurious magnetostatic modes on the resonator could cause false triggers in the digital processing techniques, analog processing to determine relative position of the output with respect to the sweeping waveform is possible. Two such approaches are shown in FIG. 9. FIG. 9a is similar to the prior art approaches associated with mechanical scanning of the resonators except that the sweeping is a linear triangular waveform and an attempt is made to normalize the output of the detector versus input signal amplitude by using a logarithmic amplifier 70 at its output. The analog phase detector comprises an analog multiplier 72, which multiplies the output from the log video amplifier 70 by the output of triangular waveform generator 71 (which also drives the bandwidth control 73 and air coil driver 75), and an integrator 74. The relative position or phase of the detected output and the sweeping waveform is measured by the voltage output of integrator 74. The limitations of this approach are the slope dependence of the overall discriminator curve on the shape and output voltage level of the logarithmic amplifier.

Prior art approaches to processing the analog output of a cyclically sweeping resonator have depended on a phase detector that used the resonator driving waveform as a reference to account for the effective phase reversal of the RF detector output on alternate positive and negative tuning excursions (see FIGS. 4c or 4e). Such phase reversals preclude the possibility of using a narrow band filter at the output of the RF detector to isolate the fundamental component of the cyclical waveform. The reason for this is because in this case the filter is alternately excited by opposite phase video inputs, and the phase and amplitude of the filter output are a complex function of the relative position of the RF detector output and the sweep waveform. In the current invention, one unique embodiment of the means for comparing the phase of the resonator sweeping means to the output of the RF detector consists of using a sawtooth waveform shown in FIG. 9b to drive the resonator. In this case the analog outputs from the detector are all in proper phase so that a narrow band filter can be used to extract the fundamental frequency from the waveform. It can readily be shown that the phase of the fundamental component of the waveform is a linear function of the position of the detector output relative to the sweeping waveform.

The importance of processing the detector output through a narrow bandwidth filter is severalfold:

1. The filter prior to phase detection limits the noise bandwidth of the phase comparison means and extends its capability to accurately measure the phase of low level signals relative to the sweeping means.

2. The filter reduces the sensitivity of the processor to sharp variations or discontinuities in the shape of the detected output, e.g., spurious resonances caused by magnetostrictive modes.

3. The filter eliminates harmonics and allows the amplitude of the signal to be limited thereby eliminating dependence of the phase detector output on the amplitude of the RF detector 28 or log video output 29 in FIG. 2.

Figure 9B:
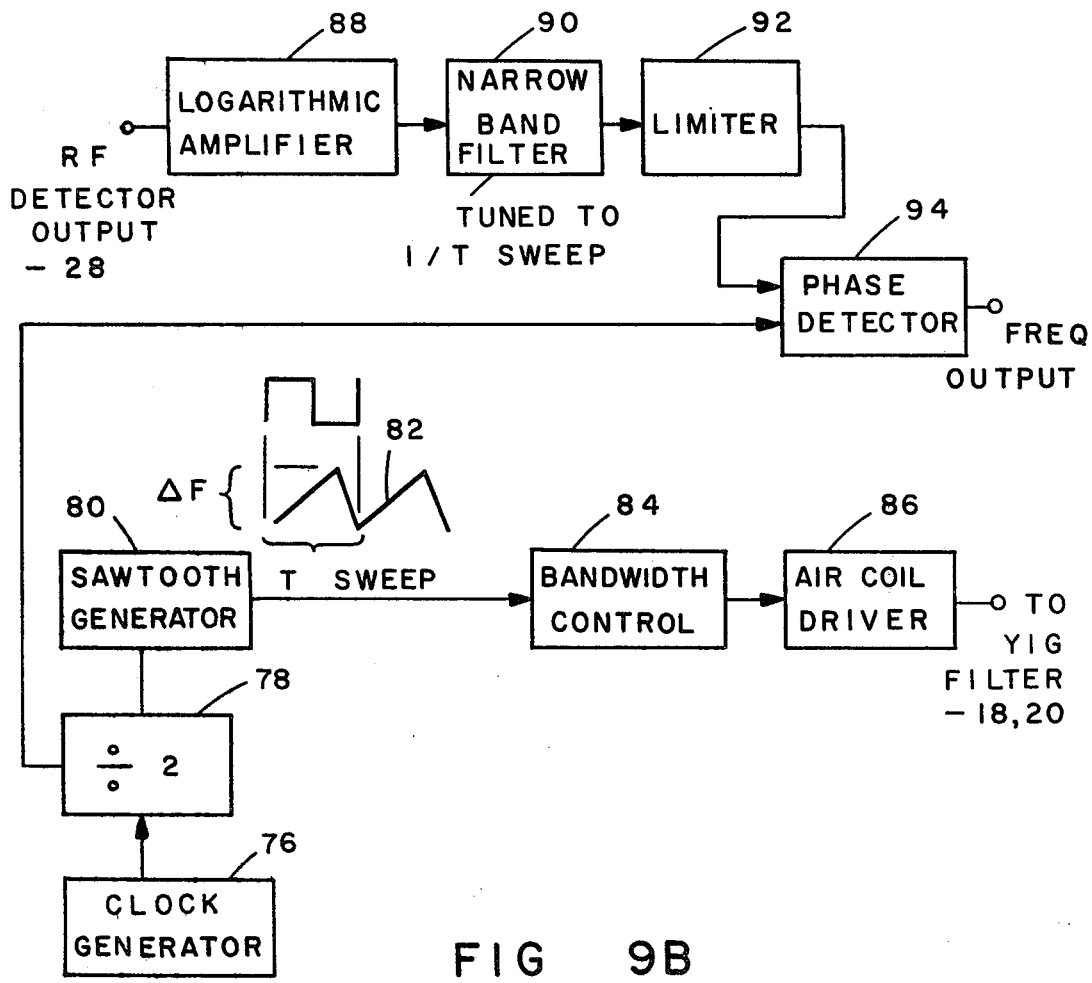

FIG. 9b is a block diagram illustrating operation of this unique phase comparison embodiment. Clock generator 76 is divided by 2 in digital divider 78. The divider output triggers sawtooth generator 80 putting out the voltage waveform 82 shown. The sawtooth retrace is about 10 percent of the total period. The sawtooth voltage is scaled in bandwidth control 84 and then applied to air coil driver 86 to sweep the resonator in one direction only. The RF detector 28 output is amplified in logarithmic amplifier 88 and the fundamental component of the detected output is filtered in narrow bandwidth filter 90 tuned to the reciprocal of the sweep time. The output of this filter is applied to limiter 92 to eliminate amplitude variations in the input, and the limited signal is applied to phase detector 94 and compared with the reference phase from divider 78. Phase detector 94 provides an output voltage that is linearly proportional to the relative position of the detector output with the sweeping sawtooth waveform, thereby generating the desired discriminator curve.

These and other variations of the means for comparing the detector output to the phase of the sweeping means will become obvious to persons of ordinary skill in the art to generate the necessary discriminator characteristics.

The present novel wide bandwidth discriminator has application in all areas where conventional discriminator techniques are used as well as several areas of application that can exploit its unique characteristics. In addition to its obvious discriminator advantages, the center frequency of the discriminator can be tuned in a single magnetic housing from the low frequency limit of YIG devices (about 200 MHz) to the magnetic saturation capability of the magnet (above 40 GHz). This tuning of center frequency can be continuous and the actual resonator can be as small as or smaller than 0.010 inches in diameter. It is, therefore, possible to put several discriminators under the same magnet housing. This could serve to optimize performance versus frequency, e.g., a gallium doped YIG sphere could cover the 200 to 4 GHz range; a 20 mil YIG sphere could cover the 4 GHz to 18 GHz range and a 10 mil sphere of pure YIG sphere could optimize coupling to 40 GHz. Further, placing several discriminators in the same magnetic housing could serve to provide tracking discriminators inside the same magnetic package, e.g., DC current offsets in two coils could keep the two discriminators 60 MHz apart so that signal sources could be controlled at a given frequency offset over a broad center frequency range.

Demodulation of FM Signals

This novel bandwidth discriminator technique provides a discriminator that makes practical low cost FM communications systems at microwave frequencies. Most microwave communication (low cost systems) use AM modulation techniques because low cost FM discriminators were not previously available. This novel discriminator brings into the microwave region all of the advantages that FM communication has over AM in the lower frequency broadcast bands. In fact, at microwave frequencies in the presence of multipath reflections and large amplitude variations in received signal level, the basic advantages of FM are even more significant.

The advantages of the discriminator according to this invention are particularly significant in this embodiment:

Linearity—critical to accurately reproduce input signal.

Insensitivity to signal variations—eliminates need for RF limiter—allows operation in environment causing rapid or severe changes in input amplitude.

Sensitivity to low level signals—amplification can be provided after detection thereby eliminating cost of RF preamplification.

Rejection of interferring signals—can pick out largest signal in environment.

Simple center frequency tuning—using air coil tuning, discriminator can readily track the center frequency.

Variable ΔF range—can capture signals over a wide range and then adapt ΔF sweep to match source and maximize detection slope.

Simplicity—entire discriminator can consist of antenna, permanent magnet, a single YIG sphere, tuning coil, diode detector, video amplifier, phase detector, filter and AM amplifier and speaker.

Figure 11:
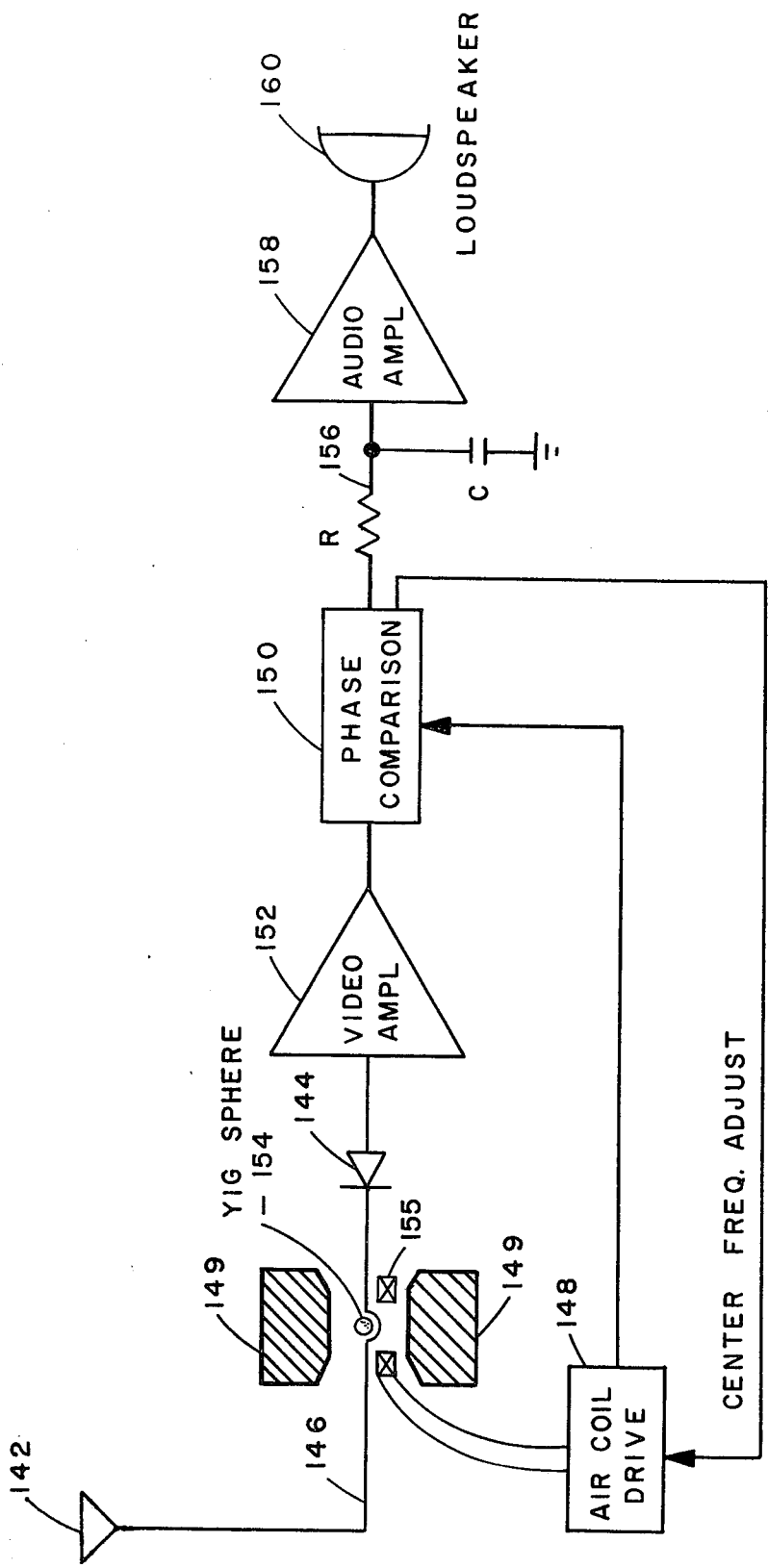
FIG. 11 is a partially schematic, block diagram of a frequency discriminator according to the present invention embodied in a frequency modulation receiver.

Referring to FIG. 11 wherein an exemplary embodiment of the frequency discriminator in an FM receiver according to the invention is shown, the FM modulated input signal is incident upon a microwave antenna system 142. The signal is routed directly to RF detector 144 through transmission line 146. The air coil drive 148 is set for maximum ΔF to ensure capturing the signal. The offset frequency of $F_o$ relative to the permanent magnet 149 bias field is measured in phase detector 150 and a DC current to air coil drive 148 centers the discriminator (provides automatic frequency control). Next, the ΔF range is optimized to match the input signal deviation. Video amplifier 152 amplifies signal generated as YIG 154 sweeps through RF input signal (either band-pass or band-reject can be used) by means of air core coil 155. Phase detector 150 basically compares the RF detector 144 output position to the sweep waveform creating a conventional FM discriminator curve using methods such as depicted in FIGS. 8 and 9. This output is filtered in the RC circuit 156 to remove the sample rate from discriminator and to pass the modulation rate. For example, for voice communication, the sample rate should be twice the maximum modulation rate to recreate the original information. Audio amplifier 158 drives speaker 160.

Since the sample rate can be in MHz range, it is also possible to use this technique to demodulate pulse code modulated data communications and multiple subcarriers. Sensitivity could be improved by means of a solid state RF amplifier inserted after antenna 142. The YIG and such an amplifier could be combined. With preamplification, a band-pass YIG configuration would improve the sensitivity by reducing the noise bandwidth of the receiver and simultaneously reducing off-channel interference.

An alternate embodiment is to couple into YIG resonator 154 with techniques that are conventionally known to use non-reciprocal properties of YIG. This would allow signals to propagate in one direction and isolate in the other direction. The non-reciprocal capability of YIG material is useful for making negative resistance amplifiers, such as tunnel or gunn diode devices, to provide a low cost RF preamplifier.

It will be understood that the foregoing description of the preferred embodiments are not to be considered limiting as to the scope of the invention. Modifications of the disclosed embodiments will occur to those of ordinary skill in the art. The scope of the invention is therefore to be limited only by the appended claims.

I claim:

1. Ferrimagnetic frequency discriminator apparatus, comprising
    ferrimagnetic filter means having an input and an output including magnetizing structure means having a single magnetic gap in which at least one ferrimagnetic resonator element is located,
    means receiving signals applied to said discriminator apparatus for coupling said signals to said ferrimagnetic filter means input,
    means coupled to said ferrimagnetic filter means for electronically cyclically sweeping the frequency of said ferrimagnetic filter means through a frequency range at a sample rate at least twice as great as the information rate of signals to be discriminated,
    detector means having an input and an output, for detecting signals at the output of said ferrimagnetic filter means,
    means for connecting the output of said ferrimagnetic means to the input of said detector means, and
    means coupled to said sweeping means and to the output of said detector means for comparing the timing relationship of said sweeping means and said detector output to generate a discriminator output wherein the discriminator output amplitude versus input signal frequency characteristic is substantially linear.

2. The combination of claim 1 wherein said at least one ferrimagnetic resonator element is in a band pass filter configuration.

3. The combination of claim 1 wherein said at least one ferrimagnetic resonator element is in a band reject filter configuration.

4. The combination of claims 2 or 3 wherein said means for sweeping the frequency of said ferrimagnetic filter means comprises means for applying a cyclical magnetic field to said at least one ferrimagnetic resonator element, the frequency of said ferrimagnetic filter means being substantially directly proportional to said magnetic field.

5. The combination of claim 4 wherein said means for applying a cyclical magnetic field includes an electromagnet coil located in said magnetizing structure means magnetic gap.

6. The combination of claim 5 wherein said electromagnet coil is an air coil.

7. The combination of claims 2 or 3 wherein said magnetizing structure means includes a permanent magnet for biasing said at least one ferrimagnetic resonator element to establish a quiescent ferrimagnetic filter means frequency.

8. The combination of claim 5 wherein said magnetizing structure means includes a permanent magnet for biasing said at least one ferrimagnetic resonator element to establish a quiescent ferrimagnetic filter means frequency.

9. The combination of claims 2 or 3 wherein said magnetizing structure means includes electromagnetic means for biasing said at least one ferrimagnetic resonator element to establish a quiescent ferrimagnetic filter means frequency.

10. The combination of claim 5 wherein said magnetizing structure means includes electromagnetic means for biasing said at least one ferrimagnetic resonator element to establish a quiescent ferrimagnetic filter means frequency.

11. The combination of claim 9 wherein said electromagnetic means generates a variable magnetic field to establish a variable quiescent ferrimagnetic filter means frequency.

12. The combination of claim 10 wherein said electromagnetic means generates a variable magnetic field to establish a variable quiescent ferrimagnetic filter means frequency.

13. The combination of claims 2 or 3 wherein the width of the frequency range through which the ferrimagnetic filter means is swept is variable.

14. The combination of claim 5 wherein the width of the frequency range through which the ferrimagnetic filter means is swept is variable.

15. The combination of claim 11 wherein the width of the frequency range through which the ferrimagnetic filter means is swept is variable.

16. The combination of claim 4 wherein said cyclical magnetic field is varied in accordance with a triangular waveform.

17. The combination of claims 2 or 3 wherein said magnetizing structure means has only one ferrimagnetic resonator element.

18. The combination of claims 2 or 3 wherein said magnetizing structure means has more than one ferrimagnetic resonator element.

19. The combination of claims 2 or 3 wherein said timing relationship comparison means comprises means for comparing the phase of said sweeping means to the output of said detector means.

20. The combination of claims 2 or 3 wherein said timing relationship comparison means comprises means referenced to said sweeping means for comparing said detector means outputs.

21. Microwave frequency modulation receiver apparatus, comprising
ferrimagnetic filter means having an input and an output including magnetizing structure means having a single magnetic gap in which at least one ferrimagnetic resonator element is located,
means receiving microwave signals applied to said discriminator apparatus for coupling said signals to said ferrimagnetic filter means input,
means coupled to said ferrimagnetic filter means for electronically cyclically sweeping the frequency of said ferrimagnetic filter means through a frequency range at a sample rate at least twice as great as the modulation rate of signals to be discriminated,
detector means having an input and an output, for detecting signals at the output of said ferrimagnetic filter means,
means for connecting the output of said ferrimagnetic means to the input of said detector means,
means coupled to said sweeping means and to the output of said detector means for comparing the timing relationship of said sweeping means and said detector output to generate a discriminator output wherein the discriminator output amplitude versus input signal frequency characteristic is substantially linear.

22. The combination of claim 21 further comprising audio amplifier means receiving the discriminator output, and
loudspeaker means receiving the amplified discriminator output.

23. The combination of claims 21 or 22 wherein said means for applying received microwave signals includes antenna means.

24. The combination of claim 21 wherein said at least one ferrimagnetic resonator element is in a band pass filter configuration.

25. The combination of claim 21 wherein said at least one ferrimagnetic resonator element is in a band reject filter configuration.

26. The combination of claims 24 or 25 wherein said magnetizing structure means includes a permanent magnet.

27. The combination of claims 24 or 25 wherein said means for sweeping the frequency of said ferrimagnetic filter means comprises means for applying a cyclical magnetic field to said at least one ferrimagnetic resonator element, the frequency of said ferrimagnetic filter means being substantially directly proportional to said magnetic field.

28. The combination of claim 27 wherein said means for applying a cyclical magnetic field includes an electromagnet coil located in said magnetizing structure means magnetic gap.

29. The combination of claims 24 or 25 wherein said timing relationship comparison means comprises means for comparing the phase of said sweeping means to the output of said detector means.

* * * * *